US011421072B2

(12) United States Patent
Hirayama

(10) Patent No.: US 11,421,072 B2
(45) Date of Patent: Aug. 23, 2022

(54) PHOTOSENSITIVE EPOXY RESIN COMPOSITION FOR FORMATION OF OPTICAL WAVEGUIDE, CURABLE FILM FOR FORMATION OF OPTICAL WAVEGUIDE, OPTICAL WAVEGUIDE PRODUCED BY USING THE RESIN COMPOSITION OR THE CURABLE FILM, AND HYBRID FLEXIBLE PRINTED WIRING BOARD FOR OPTICAL/ELECTRICAL TRANSMISSION

(71) Applicant: NITTO DENKO CORPORATION, Ibaraki (JP)

(72) Inventor: Tomoyuki Hirayama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 116 days.

(21) Appl. No.: 16/466,375

(22) PCT Filed: Nov. 1, 2017

(86) PCT No.: PCT/JP2017/039519
§ 371 (c)(1),
(2) Date: Jun. 4, 2019

(87) PCT Pub. No.: WO2018/116648
PCT Pub. Date: Jun. 28, 2018

(65) Prior Publication Data
US 2020/0071454 A1 Mar. 5, 2020

(30) Foreign Application Priority Data

Dec. 21, 2016 (JP) .............................. JP2016-247679

(51) Int. Cl.
| | |
|---|---|
| *C08G 59/24* | (2006.01) |
| *C08G 59/22* | (2006.01) |
| *C09D 163/00* | (2006.01) |
| *G03F 7/039* | (2006.01) |
| *G03F 7/038* | (2006.01) |
| *G02B 6/12* | (2006.01) |
| *H05K 1/02* | (2006.01) |

(52) U.S. Cl.
CPC ......... *C08G 59/245* (2013.01); *C08G 59/226* (2013.01); *C09D 163/00* (2013.01); *G02B 6/12* (2013.01); *G03F 7/039* (2013.01); *G03F 7/0385* (2013.01); *H05K 1/028* (2013.01); *H05K 1/0274* (2013.01); *G02B 2006/12073* (2013.01)

(58) Field of Classification Search
CPC .................................................. C09D 163/00
See application file for complete search history.

(56) References Cited

U.S. PATENT DOCUMENTS

| | | |
|---|---|---|
| 2003/0087189 A1 | 5/2003 | Takagi et al. |
| 2005/0239295 A1 | 10/2005 | Wang et al. |
| 2011/0280531 A1 | 11/2011 | Hirayama |
| 2012/0033913 A1 | 2/2012 | Kondou et al. |
| 2013/0236149 A1 | 9/2013 | Hirayama |
| 2014/0152984 A1 | 6/2014 | Yoshida |
| 2016/0070029 A1 | 3/2016 | Hirayama |
| 2016/0083505 A1 | 3/2016 | Tanaka |
| 2016/0326298 A1 | 11/2016 | Hirayama et al. |
| 2017/0291984 A1 | 10/2017 | Hirayama |

FOREIGN PATENT DOCUMENTS

| | | |
|---|---|---|
| CN | 1433532 A | 7/2003 |
| CN | 103309153 A | 9/2013 |
| CN | 105102500 A | 11/2015 |
| CN | 105829931 A | 8/2016 |
| EP | 2975073 A1 | 1/2016 |
| JP | 2001-281475 A | 10/2001 |
| JP | 2010-230944 A | 10/2010 |
| JP | 2010-243920 A | 10/2010 |
| JP | 2011-27903 A | 2/2011 |
| JP | 2011-237645 A | 11/2011 |
| JP | 2014-132064 A | 7/2014 |
| JP | 2014-215531 A | 11/2014 |
| JP | 2014-224205 A | 12/2014 |
| JP | 2016-130302 A | 7/2016 |
| KR | 10-2016-0002758 A | 1/2016 |
| TW | 201443142 A | 11/2014 |
| TW | 201619701 A | 6/2016 |

(Continued)

OTHER PUBLICATIONS

Notification of Transmittal of the International Preliminary Report on Patentability (Form PCT/IB/338) issued in counterpart International Application No. PCT/JP2017/039519 dated Jul. 4, 2019 with Forms PCT/IB/373 and PCT/ISA/237. (9 pages).
Office Action dated Oct. 27, 2020, issued in counterpart Chinese Application No. 201780075518.3 (w/ English translation; 17 pages).
International Search Report dated Feb. 6, 2018, issued in counterpart International Application No. PCT/JP2017/039519 (2 pages).

(Continued)

*Primary Examiner* — Ian A Rummel
(74) *Attorney, Agent, or Firm* — WHDA, LLP

(57) ABSTRACT

A photosensitive epoxy resin composition for formation of an optical waveguide is provided, which contains an epoxy resin component, and a photo-cationic polymerization initiator, wherein the epoxy resin component includes a solid semi-aliphatic bifunctional epoxy resin. The optical waveguide formation photosensitive epoxy resin composition is usable as an optical waveguide forming material having higher R-to-R (roll-to-roll) adaptability (lower tackiness and uncured-state flexibility), a lower refractive index, excellent patternability, and excellent laser processability mirror forming processability).

8 Claims, No Drawings

(56) References Cited

FOREIGN PATENT DOCUMENTS

| WO | 2006003990 A1 | 1/2006 | |
| WO | WO-2014174924 A1 * | 10/2014 | ............. G02B 1/046 |

OTHER PUBLICATIONS

Extended (Supplementary) European Search Report dated Jul. 9, 2020, issued in counterpart EP Application No. 17882871.1. (6 pages).

Office Action dated Jul. 28, 2020, issued in counterpart JP Application No. 2016-247679, with English translation (8 pages).

Office Action dated Mar. 9, 2020, issued in counterpart CN Application No. 201780075518.3, with English translation (16 pages).

Office Action dated Dec. 10, 2021, issued in counterpart Taiwanese Application No. 106137780 (w/ English translation; 12 pages).

Office Action dated Dec. 14, 2021, issued in counterpart Korean Application No. 10-2019-7016277 (w/ English translation; 6 pages).

* cited by examiner

PHOTOSENSITIVE EPOXY RESIN COMPOSITION FOR FORMATION OF OPTICAL WAVEGUIDE, CURABLE FILM FOR FORMATION OF OPTICAL WAVEGUIDE, OPTICAL WAVEGUIDE PRODUCED BY USING THE RESIN COMPOSITION OR THE CURABLE FILM, AND HYBRID FLEXIBLE PRINTED WIRING BOARD FOR OPTICAL/ELECTRICAL TRANSMISSION

TECHNICAL FIELD

The present disclosure relates to an optical waveguide formation photosensitive epoxy resin composition and an optical waveguide formation curable film to be used as materials for formation of a cladding layer, a core layer or the like of an optical waveguide in an optical/electrical transmission hybrid flexible printed wiring board which is widely used for optical communications, optical information processing, and other general optics. The present disclosure further relates to an optical waveguide produced by using the resin composition or the curable film, and to a hybrid flexible printed wiring board for optical/electrical transmission.

BACKGROUND ART

Conventionally, various photosensitive epoxy resin compositions are used as optical waveguide forming materials (so-called cladding layer forming materials, core layer forming materials, and the like) for hybrid flexible printed wiring boards for optical/electrical transmission. Where a cladding layer or a core layer is formed in a predetermined pattern by using any of the photosensitive epoxy resin compositions, for example, the formation of the predetermined cladding layer pattern or core layer pattern is achieved by irradiation with ultraviolet (UV) radiation via a photomask More specifically, the cladding layer or the core layer is formed by using a liquid photosensitive epoxy resin composition as an optical waveguide forming material to form a film (layer) and then irradiating the film (layer) with UV radiation via the photomask.

Such a photosensitive epoxy resin composition has high photocurability, but is disadvantageous in that the photosensitive epoxy resin composition cannot be employed for a continuous process such as an R-to-R process because of the surface tackiness of a coating film of the photosensitive epoxy resin composition (i.e., the film of the photosensitive epoxy resin composition is liable to be broken when being brought into contact with a roll) and, hence, has lower productivity (PTL 1) Therefore, a resin component that is solid at an ordinary temperature is generally used as a photosensitive resin for R-to-R process adaptability. As the molecular weight of the photosensitive resin increases, the flexibility of an uncured amorphous film of the resulting resin composition is increased, but the patterning resolution is reduced. As the molecular weight of the photosensitive resin decreases, on the other hand, the patterning resolution is increased, but the flexibility is reduced. Problematically, the flexibility and the patterning resolution of the film are generally in a tradeoff relationship. Therefore, there is a demand for an optical waveguide forming material which satisfies the requirements for both the flexibility and the patterning resolution of the film. For example, a resin composition containing epoxy-containing acryl rubber, urethane (meth)acrylate or (meth)acrylate free from a urethane bond is proposed as a cladding layer forming material for an optical waveguide (PTL 2).

Incidentally, the optical waveguide cladding layer forming material needs to satisfy requirements for various physical properties such as lower refractive index, higher transparency, higher-resolution patternability, higher heat resistance, and laser processability at a wavelength of 248 nm (mirror forming processability for forming a mirror at an angle of 45 degrees with respect to a cladding layer surface by irradiation with laser at a wavelength of 248 nm (45-degree mirror forming process)) in a cured state accord ng to its use purpose. Therefore, makers conduct studies to provide a forming material satisfying the aforementioned property requirements by selecting proper ingredients and a balanced formulation in production of the optical waveguide.

In the aforementioned R-to-R process for mass production, a dry film technique is generally employed in which the uncured film is used in a dry film form. In development of the material, requirements for R-to-R process adaptability of the dry film material (e.g., lower tackiness and flexibility of the uncured film) consequently reduce the material design flexibility. In addition to the reduction in material design flexibility, the need for provision of lamination bases on opposite surfaces of the dry film is disadvantageous for resource saving and costs in the formation of the dry film. Therefore, the adaptability to a wet process is also regarded important in the development of the material (PTL 3).

In view of such technical background, a photosensitive epoxy resin composition satisfying the aforementioned property requirements is developed, for example, by using a specific novolak polyfunctional epoxy resin as a base material and adding various resins to the epoxy resin (PTL 4).

RELATED ART DOCUMENT

Patent Document

PTL 1: JP-A-2001-281475
PTL 2: JP-A-2011-27903
PTL 3: JP-A-2010-230944
PTL 4: JP-A-2011-237645

SUMMARY

In the aforementioned technique, a liquid resin having an uncured-state flexibility imparting effect is used for imparting the uncured resin with flexibility, but the amount of the liquid resin to be used is significantly limited in order to suppress the tackiness. Thus, there is limitation in imparting the uncured resin with the flexibility. In production of the optical waveguide by a photolithography process including a lot of steps, it is currently impossible to impart the uncured resin with sufficient flexibility because of handling difficulty.

Therefore, there is a demand for an optical waveguide forming material which satisfies the requirements for the various physical properties of the optical waveguide, and more effectively achieves a tradeoff between the lower tackiness and the uncured-state flexibility in the R-to-R process.

In view of the foregoing, the present disclosure provides an optical waveguide formation photosensitive epoxy resin composition and an optical waveguide formation curable film having higher R-to-R adaptability (lower tackiness and higher flexibility in the uncured resin state), a lower refractive index, excellent patternability, and excellent laser processability (excellent mirror forming processability) for use as an optical waveguide forming material, and provides an optical waveguide produced by using the photosensitive epoxy resin, composition or the curable film, and a hybrid flexible printed wiring board for optical/electrical transmission.

According to a first aspect of the present disclosure to achieve the above object, there is provided a photosensitive epoxy resin composition for formation of an optical waveguide, the photosensitive epoxy resin composition containing an epoxy resin component and a photo-cationic polymerization initiator, wherein the epoxy resin component includes a solid semi-aliphatic bifunctional epoxy resin.

According to a second aspect of the present disclosure, there is provided an optical waveguide formation curable film formed from the optical waveguide formation photosensitive epoxy resin composition of the first aspect. According to a third aspect of the present disclosure, there is provided an optical waveguide, which includes a substrate, a cladding layer provided on the substrate, and a core layer provided in a predetermined pattern in the cladding layer for transmission of an optical signal, wherein the cladding layer or the core layer comprises a cured product of the optical waveguide formation photosensitive epoxy resin composition of the first aspect.

According to a fourth aspect of the present disclosure, there is provided a hybrid flexible printed wiring board for optical/electrical transmission, which includes the optical waveguide of the third aspect.

The inventor conducted intensive studies to provide a photosensitive epoxy resin composition which has proper R-to-R adaptability (lower tackiness and higher flexibility in the uncured resin state), a lower refractive index, excellent patternability, and excellent laser processability. As a result, the inventor found that, where the epoxy resin component including the solid semi-aliphatic bifunctional epoxy resin is used, the intended object can be achieved.

[1] R-to-R Adaptability (Lower Tackiness and Higher Flexibility in Uncured Resin State)

The solid semi-aliphatic bifunctional epoxy resin is used as the specific epoxy resin for the R-to-R adaptability. In general, the flexibility of the resin is attributable to the toughness of the resin caused by entanglement of molecules of the resin and the diversified possible conformations of main chains of the molecules of the resin. A solid resin having a higher softening point and a molecular weight higher than a certain level exhibits higher flexibility in an uncured state. This is due to the fact that the higher molecular weight resin has a higher degree of entanglement (interaction) of the main chains thereof. If a solid resin having a higher softening point is blended, however, a coating varnish having such a formulation is liable to have a higher viscosity, resulting in the need for use of an excess amount of a solvent component. Therefore, the varnish is not suitable for formation of a thicker coating film. In addition, the patternability is liable to be poorer.

On the other hand, a resin material having a lower softening point is expected to have higher flexibility in an uncured state due to the diversified possible conformations of main chairs of molecules thereof without the interaction of the main chains because the main chains are weakly entangled. However, a resin material having a softening point of a middle temperature range between a higher temperature range and a lower temperature range is significantly influenced by the drawbacks of the higher-softening-point material and the lower-softening point material, and tends to have poorer flexibility. In the conventional art, therefore, the amount of a liquid component to be added is reduced to a minimum level free from the tackiness by using the lower-softening point resin as a main ingredient, whereby the resin composition is imparted with proper uncured-state flexibility without tackiness. Where the lower-softening point resin material is used as the base resin and the resin composition is imparted with the uncured-state flexibility by adding the minimum amount of the liquid component, however, the R-to-R process adaptability is insufficient. Thus, there is limitation in imparting the resin composition with the flexibility by the tradeoff between the tackiness and the uncured-state flexibility in the formulation design. Therefore, the resin composition suffers from irregular cracking in the production process. In the present disclosure, the tradeoff between the uncured-state flexibility and the non-tackiness is advantageously achieved by using the solid semi-aliphatic epoxy resin instead of the liquid semi-aliphatic epoxy resin for imparting the resin composition with the uncured-state flexibility in the formulation design.

[2] Device Mountability

In general, an attempt is made to impart the resin composition with higher uncured-state flexibility for the R-to-R adaptability by adding a long-chain bifunctional semi-aliphatic epoxy resin to the resin composition. The improvement of the uncured-state flexibility improves the flexibility of a cured product formed by curing the resin composition. For device mounting, a flip chip mounting method is generally employed. In this case, if the cured product has higher flexibility, the cured product is more liable to release vibration energy due to the flexibility thereof, thereby reducing the device mountability. Therefore, the uncured-state flexibility and the device mountability are in a tradeoff relationship. In the present disclosure, the solid semi-aliphatic bifunctional epoxy resin that ensures the device mountability is blended in the resin composition, and the amount of the solid semi-aliphatic bifunctional epoxy resin is preferably set to a predetermined level to adjust the flexibility of the uncured resin, thereby achieving the tradeoff between the uncured-state flexibility and the device mountability.

More preferred embodiments for the patternability and the laser processability have been studied in addition to the above. The results are as follows:

[3] Patternability

In a photolithography process using a photocurable resin composition, it is generally considered difficult to impart the resin composition with sufficient patternability only by using the ordinary long-chain bifunctional epoxy resin, and considered essential to add a polyfunctional epoxy resin to the resin composition. In the present disclosure, the resin composition is imparted with more excellent patternability by adding the polyfunctional epoxy resin as well as the solid semi-aliphatic bifunctional epoxy resin in controlled amounts to the resin composition.

[4] Laser Processability

For fine processing with the use of laser at a wavelength of 248 nm, for example, it is necessary to use a formulation in which an aromatic epoxy resin is used alone as the epoxy resin component. Where the formulation containing the aromatic epoxy resin is used for the cladding layer, it is essential to add a certain amount of an aliphatic epoxy resin to the cladding layer forming material in order to provide a proper difference in refractive index between the cladding layer and the core layer. In the present disclosure, a minimum amount of the aliphatic epoxy resin that allows for proper laser processability is preferably added to the resin composition, so that the requirements for both the lower refractive index and the laser processability of the cladding layer can be satisfied.

The optical waveguide formation photosensitive epoxy resin composition of the present disclosure contains the epoxy resin component including the solid semi-aliphatic bifunctional epoxy resin, and the photo-cationic polymerization initiator. Where the optical waveguide formation photosensitive epoxy resin composition is used for formation of the cladding layer or the core layer of the optical waveguide, therefore, the cladding layer or the core layer can be formed as having higher R-to-R adaptability (lower tackiness and higher uncured-state flexibility), a lower refractive index, excellent patternability, and excellent laser processability without modifying the conventional production process.

Where the solid semi-aliphatic bifunctional epoxy resin is present in a proportion of 10 to 50 wt. % in the epoxy resin component, the tackiness is further suppressed, and the device mountability is further improved.

Where an aromatic ring-containing epoxy resin including the solid semi-aliphatic bifunctional epoxy resin is present in a proportion of not less than 65 wt. % based on the overall weight of the epoxy resin component in the epoxy resin component, the laser processability is further improved.

Where the epoxy resin component includes (i) a polyfunctional epoxy resin, and (ii) a bifunctional epoxy resin other than the solid semi-aliphatic bifunctional epoxy resin, in addition to the solid semi-aliphatic bifunctional epoxy resin, the cladding layer or the core layer can be formed as having higher R-to-R adaptability (lower tackiness and higher uncured-state flexibility), excellent patternability, and more excellent laser processability.

Where the polyfunctional epoxy resin is present in a proportion of not less than 40 wt. % based on the overall weight of the epoxy resin component, and the bifunctional epoxy resin other than the solid semi-aliphatic bifunctional epoxy resin is present in a proportion of not greater than 50 wt. % based on the overall weight of the epoxy resin component, the patternability and other physical properties are further improved.

Where the optical waveguide formation photosensitive epoxy resin composition is provided in a film form, the working efficiency is improved in the optical waveguide production process.

DESCRIPTION OF EMBODIMENTS

Next, embodiments of the present disclosure will be described in detail. However, it should be understood that the present disclosure be not limited to these embodiments <<Photosensitive Epoxy Resin Composition for Formation of Optical Waveguide>>

A photosensitive epoxy resin composition of the present disclosure for formation of an optical waveguide (hereinafter sometimes referred to simply as "photosensitive epoxy resin composition") is prepared by using a specific epoxy resin component and a photo-cationic polymerization initiator. In the present disclosure, the term "liquid" or "solid" means that a substance is fluid in a "liquid" state or nonfluid in a "solid" state at an ordinary temperature (25° C.±5° C.). In the present disclosure, the term "ordinary temperature" means a temperature range of 25° C.±5° C. as described above.

The ingredients will hereinafter be described in turn.

<Specific Epoxy Resin Component>

The specific epoxy resin component includes a solid semi-aliphatic bifunctional epoxy resin. The solid semi-aliphatic bifunctional epoxy resin is an aromatic ring-containing aliphatic epoxy resin which is in the solid state at the ordinary temperature and has two functional groups in its molecule.

An example of the solid semi aliphatic bifunctional epoxy resin is a solid semi-aliphatic bifunctional epoxy resin represented by the following general formula (1):

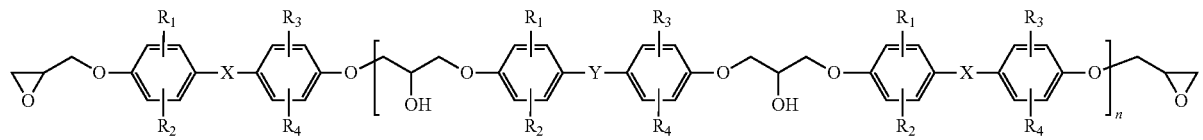

(1)

wherein $R_1$ to $R_4$, which may be the same or different, are each hydrogen atom, methyl group, chlorine atom, or bromine atom; X and Y, which may be the same or different, are each C1 to C15 alkylene group or alkyleneoxy group; and n is a positive number.

The solid semi-aliphatic bifunctional epoxy resin represented by the above formula (1) has a specific molecular chain structure having epoxy groups at opposite terminals of each molecular chain as shown above.

In the above formula (1), as described above, $R_1$ to $R_4$ are each hydrogen atom, methyl group, chlorine atom, or bromine atom, and X and Y are each C1 to C15 alkylene group or alkyleneoxy group. The repetition number n is a positive number, and is preferably not less than 1 on average. The upper limit of the repetition number n is typically 1,000.

A specific example of the solid semi aliphatic bifunctional epoxy resin is YX-7180BH40 or the like available from Mitsubishi Chemical Corporation.

The proportion of the solid semi-aliphatic bifunctional epoxy resin in the epoxy resin component is preferably 10 to 60 wt. %, more preferably 20 to 50 wt. %, particularly preferably 25 to 35 wt. %. If the proportion of the solid semi aliphatic bifunctional epoxy resin is excessively great, a coating film formed from the resin composition is liable to be tacky after being dried, making it difficult to apply to the R-to-R process for mass production. Further, a film formed from the resin composition is liable to have a reduced elasticity modulus (specifically, less than 0.8 GPa), resulting in poorer device mountability. If the proportion of the solid semi-aliphatic bifunctional epoxy resin is excessively small, an uncured film (dried coating film) formed from the resin composition is liable to be poorer in flexibility, suffering from cracking when being handled for the formation of the optical waveguide.

In the present disclosure, the proportion of an aromatic ring-containing epoxy resin including the solid semi-aliphatic bifunctional epoxy resin in the epoxy resin component is preferably not less than 65 wt. %, more preferably not less than 70 wt. %, based on the overall weight of the epoxy resin component. If the proportion of the aromatic epoxy resin is excessively small, the resin composition tends to be poorer in laser processability at a wavelength of 248 nm (mirror forming processability).

In the present disclosure, the epoxy resin component preferably has the following formulation:

The epoxy resin component preferably includes the solid semi-aliphatic bifunctional epoxy resin, the polyfunctional epoxy resin, and the bifunctional epoxy resin other than the solid semi-aliphatic bifunctional epoxy resin. This formulation of the epoxy resin component makes it possible to impart the resin composition with more excellent patternability as described above.

In the present disclosure, the polyfunctional epoxy resin is an epoxy resin containing two or more epoxy groups on average in its molecule. Examples of the polyfunctional epoxy resin include cresol novolak epoxy resin (e.g., YDCN series available from Nippon Steel & Sumikin Chemical Co., Ltd., and the like), and 1,2-epoxy-4-(2-oxiranyl) cyclohexane adduct of 2,2-bis(hydroxymethyl)-1-butanol (e.g., EHPE3150 available from Daicel Corporation). Other examples of the polyfunctional epoxy resin include trifunctional solid aliphatic epoxy resins such as 1,3,5-trisglycidyl isocyanurate (e.g., TEPIC-S available from Nissan Chemical Industries, Ltd.), phenol novolak epoxy resin (e.g., YDPN series available from Nippon Steel & Sumikin Chemical Co., Ltd., and the like), and specific novolak epoxy resin (e.g., 157370 available from Mitsubishi Chemical Corporation, and the like) These may be used alone or in combination.

The proportion of the polyfunctional epoxy resin is preferably not less than 40 wt. %, more preferably 50 to 70 wt. %, based on the overall weight of the epoxy resin component. If the proportion of the polyfunctional epoxy resin is excessively small, the resin composition tends to be poorer in patternability.

The bifunctional epoxy resin other than the solid semi-aliphatic bifunctional epoxy resin is a bifunctional epoxy resin containing two epoxy groups in its molecule. Examples of the bifunctional epoxy resin include bisphenol-A epoxy resin, fluorene epoxy resin, and hydrogenated bisphenol-A epoxy resin (e.g., YX-8040 available from Mitsubishi Chemical Corporation). These may be used alone or in combination. Specific examples of the bisphenol-A epoxy resin include jER1001, jER1002, jER1003, and jER1007 (all available from Mitsubishi Chemical Corporation), and EPIKOTE 1006FS available from Japan Epoxy Resin Co., Ltd.

The proportion of the bifunctional epoxy resin other than the solid semi-aliphatic bifunctional epoxy resin is preferably not greater than 50 wt. %, more preferably not greater than 40 wt. %, based on the overall weight of the epoxy resin component. If the proportion of the bifunctional epoxy resin other than the solid semi-aliphatic bifunctional epoxy resin is excessively great, the resin composition tends to have unbalanced physical properties, making it difficult to provide the intended effect.

A feature of the present disclosure is that the solid semi-aliphatic bifunctional epoxy resin is used as the epoxy resin component. Particularly preferably, a solid aromatic polyfunctional epoxy resin, an aliphatic polyfunctional epoxy resin, an aromatic bifunctional epoxy resin, and an aliphatic bifunctional epoxy resin are used in combination with the solid semi-aliphatic bifunctional epoxy resin as the epoxy resin component.

<Photo-Cationic Polymerization Initiator>

In the present disclosure, the photo-cationic polymerization initiator (photoacid generator) is used to impart the photosensitive epoxy resin composition with photocurability, e.g., curability by irradiation with ultraviolet radiation.

Examples of the photo-cationic polymerization initiator include triohenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorphosphate, 4-chlorophenyldiphenylsulfonium hexafluoroantimonate, bis[4-diphenylsulfonio]phenyl]sulfide bishexafluorophosphate, bis[4-(diphenylsulfonio)phenyl]sulfide bishexafluoroantimonate, (2,4-cyclopentadiene-1-yl)[(1-methylethyl)benzene]-Fe-hexa fluorophosphate, and diphenyliodonium hexafluoroantimonate, which may be used alone or in combination.

Specific examples of the photo-cationic polymerization initiator include triphenylsulfonium hexafluoroantimonate types SP-170 (available from ADEKA Corporation), CPI-101A (available from San-Apro, Ltd.), and WPAG-1056 (available from Wako Pure Chemical Industries, Ltd.), and diphenyliodonium hexafluoroantimonate type WPI-116 (available from Wako Pure Chemical industries, Ltd.)

The proportion of the photo-cationic polymerization initiator is preferably 0.1 to 3 parts by weight, more preferably 0.25 to 2 parts by weight, based on 100 parts by weight of the epoxy resin component of the photosensitive epoxy resin composition. If the proportion of the photo-cationic polymerization initiator is excessively small, it will be difficult to impart the resin composition with satisfactory photocurability (UV-curability). If the proportion of the photo-cationic polymerization initiator is excessively great, the photosensitivity tends to be increased, resulting in abnormal shaping in the patterning. Further, required physical properties associated with an initial loss tend to be deteriorated.

As required, the photosensitive epoxy resin composition of the present disclosure may contain additives in addition to the specific epoxy resin component and the photo-cationic polymerization initiator described above. Examples of the additives include adhesiveness imparting agents such as silane coupling agent, titanium coupling agent, olefin oligomer, cycloolefin oligomer and polymer (e.g., norbornene polymer and the like), synthetic rubber, and silicone compound for enhancing the adhesiveness, various antioxidants such as hindered phenol antioxidant and phosphorus-containing antioxidant, leveling agent, and defoaming agent. These additives may be properly blended, as long as the effects of the present disclosure are not impaired. These may be used alone or in combination.

The proportion of the antioxidant is preferably less than 3 parts by weight, particularly preferably not greater than 1 part by weight, based on 100 parts by weight of the epoxy resin component if the proportion of the antioxidant is excessively great, the required physical properties associated with the initial loss tend to be deteriorated.

The photosensitive epoxy resin composition of the present disclosure can be prepared by mixing the specific epoxy resin component, the photo-cationic polymerization initiator and, as required, any of the additives in the predetermined proportions with stirring. Where the photosensitive epoxy resin composition of the present disclosure is prepared in the form of a coating varnish, the resulting mixture may be dissolved in an organic solvent with heating (e.g., to about 60° C. to about 120° C.) and stirring. The amount of the organic solvent to be used may be properly adjusted, and preferably set, for example, to 30 to 80 parts by weight, particularly preferably 40 to 70 parts by weight, based on 100 parts by weight of the epoxy resin component of the photosensitive epoxy resin composition. If the amount of the organic solvent to be used is excessively small, the prepared coating varnish tends to have a higher viscosity and hence poorer coatability. If the amount of the organic solvent to be used is excessively great, it will be difficult to form a thicker coating film with the use of the coating varnish.

Examples of the organic solvent to be used for the preparation of the coating varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane, and dimethoxyethane. These organic solvents may be used alone or in combination in a predetermined amount, for example, within the aforementioned range so as to impart the varnish with a viscosity suitable for the coating.

<<Optical Waveguide>>

The photosensitive epoxy resin composition of the present disclosure is used as a cladding layer forming material by way of example, which will hereinafter be described.

An optical waveguide of the present disclosure includes, for example, substrate, a cladding layer (under-cladding layer) provided in a predetermined pattern on the substrate, a core layer provided in a predetermined pattern on the cladding layer for transmitting an optical signal, and another cladding layer (over-cladding layer) provided over the core layer. In the optical waveguide of the present disclosure, the cladding layers are formed from the photosensitive epoxy resin composition described above. In the optical waveguide of the present disclosure, the cladding layers are required to have a lower refractive index than the core layer.

In the present disclosure, the optical waveguide can be produced, for example, through the following process steps. First, a substrate is prepared. Then, a cladding layer forming material (photosensitive varnish) is prepared by dissolving the photosensitive epoxy resin composition of the present disclosure in an organic solvent as required, and is applied onto the substrate. After the application of the cladding layer forming material (photosensitive varnish), the organic solvent is removed by heat drying. Thus, a photosensitive varnish film (photosensitive epoxy resin composition film) is formed in an uncured state. The photosensitive varnish film is cured by irradiating a varnish coating surface with light such as ultraviolet radiation and, as required, performing a heat treatment. Thus, an under-cladding layer (lower cladding layer portion) is formed.

Then, a core layer forming material (photosensitive varnish) is applied onto the under-cladding layer to form an uncured core formation layer. After the application of the core layer forming material (photosensitive varnish), the organic solvent may be removed by heat-drying in the same manner as described above, whereby a photosensitive film (core formation layer) is formed in an uncured film state. In turn, a photomask for light exposure in a predetermined pattern (optical waveguide pattern) is put on a surface of the uncured core formation layer. Then, the core formation layer is irradiated with light such as ultraviolet radiation via the photomask and, as required, is heat-treated. Thereafter, an unexposed portion (uncured portion) of the uncured core formation layer is dissolved away with the use of a developing liquid, whereby a core layer is formed as having the predetermined pattern.

Subsequently, the cladding layer forming material (photosensitive varnish) prepared by dissolving the photosensitive epoxy resin composition of the present disclosure in the organic solvent is applied over the core layer. Then, the cladding layer forming material is irradiated with light such as ultraviolet radiation and, as required, is heat-treated, whereby an over-cladding layer (upper cladding layer portion) is formed. Thus, the intended optical waveguide is produced through these process steps. Where the optical waveguide is used for an optical/electrical transmission hybrid board (opto-electric hybrid board) or a like product involving optical path deflection, the 45-degree mirror forming process is performed on a surface of the cladding layer of the optical waveguide on the board with the use of laser at a wavelength of 248 nm.

Examples of the substrate include silicon wafer, metal substrate, polymer film, and glass substrate. Examples of the metal substrate include stainless steel plates such as of JIS SUS. Specific examples of the polymer film include polyethylene terephthalate (PET) film, polyethylene naphthalate film, and polyimide film. The substrate typically has a thickness of 10 μm to 3 mm.

Specifically, the light irradiation may be irradiation with ultraviolet radiation. Exemplary ultraviolet light sources for the irradiation with the ultraviolet radiation include low-pressure mercury lamp, high-pressure mercury lamp, and ultrahigh-pressure mercury lamp. The dose of the ultraviolet radiation is typically about 10 to about 20,000 mJ/cm$^2$, preferably about 100 to about 15,000 mJ/cm$^2$, more preferably about 500 to about 10,000 mJ/cm$^2$.

After the light exposure by the irradiation with the ultraviolet radiation or the like, the heat treatment may be further performed to complete a photoreaction for the curing. The heat treatment is typically performed at 80° C. to 250° C. for 10 seconds to 2 hours, preferably at 100° C. to 150° C. for 5 minutes to 1 hour.

The core layer forming material is, for example, an epoxy resin composition containing any of various liquid epoxy resins such as bisphenol-A epoxy resin, bisphenol-F epoxy resin, hydrogenated bisphenol-A epoxy resin, fluorinated epoxy resin, and epoxy-modified silicone resin, and various solid epoxy resins such as solid polyfunctional aliphatic epoxy resin, and any of the aforementioned photoacid generators. The formulation of the core layer forming material is designed so that the core layer forming material has a higher refractive index than the cladding layer forming material. For preparation of the core layer forming material to be applied in the form of a varnish, as required, a conventionally known organic solvent may be used in a proper amount so as to impart the varnish with a viscosity suitable for the application of the varnish, and various additives (antioxidant, adhesiveness imparting agent, leveling agent, and UV absorbing agent) may be used in proper amounts as long as the functions of the optical waveguide produced by using the aforementioned cladding layer forming material are not impaired.

Examples of the organic solvent to be used for the preparation of the varnish include ethyl lactate, methyl ethyl ketone, cyclohexanone, 2-butanone, N,N-dimethylazetamide diglyme, diethylene glycol methyl ethyl ether, propylene glycol methyl acetate, propylene glycol monomethyl ether, tetramethylfurane, and dimethoxyethane as in the aforementioned case. These organic solvents may be used alone or in combination in a proper amount so as to impart the varnish with a viscosity suitable for the application of the varnish.

Exemplary methods for the application of the forming materials for the respective layers on the substrate include coating methods employing a spin coater, a coater, a spiral coater, a bar coater or the like, a screen printing method, a capillary injection method in which the material is injected into a gap formed with the use of spacers by the capillary phenomenon, and a continuous R-to-R coating method employing a coating machine such as a multi-coater. The optical waveguide may be provided in the form of a film optical waveguide by removing the substrate.

<<Mirror Forming Process>>

A known method such as laser processing method, dicing method or inprint method may be employed for the mirror forming process. Particularly, the laser processing method is preferably used. A laser light source is properly selected according to the laser oscillation wavelength. Examples of the laser light source include various gas lasers such as excimer laser, $CO_2$ laser, and He—Ne laser. Particularly, ArF excimer laser, KrF excimer laser, $F_2$ excimer laser or the like is preferably used as the laser light source.

The laser irradiation energy is properly set according to the optical waveguide material. For efficient removal of the resin component, the laser irradiation energy is preferably 100 to 1,000 $mJ/cm^2$, particularly preferably 200 to 600 $mJ/cm^2$. For improvement of the mirror forming process productivity, the laser irradiation frequency is preferably 10 to 250 Hz, particularly preferably 50 to 200 Hz. The movement speed of the laser processing object is properly set according to the optical waveguide material and the design (e.g., angle) of the mirror surface to be formed. The laser wavelength is properly set according to the optical waveguide material, but may be, for example, about 150 nm to about 300 nm.

The optical waveguide thus produced may be used as an optical waveguide, for example, for a hybrid flexible printed wiring board for optical/electrical transmission.

EXAMPLES

Next, the embodiments of the present disclosure will be described by way of examples thereof. However, it should be understood that the present disclosure be not limited to these examples. In the examples "part(s)" is based on weight, unless otherwise specified.

Before production of an optical waveguide, the following ingredients were prepared for preparation of photosensitive varnishes as a cladding layer forming material and a core layer forming material.

[Solid Semi-Aliphatic Bifunctional Epoxy Resin]
YX-7180BH40 (a solution containing a semi-aliphatic bifunctional epoxy resin (represented by the above general formula (1)) dissolved in a mixed solvent (having a cyclohexanone/methyl ethyl ketone mixing weight ratio of 1/1) and having a solid resin content of 40 wt. %) available from Mitsubishi Chemical Corporation

[Liquid Semi-Aliphatic Epoxy Resin]
EPICLON EXA-4816 available from DIC Corporation

[Solid Polyfunctional Epoxy Resin]
YDCN-700-3 (cresol novolak epoxy resin) available from Nippon Steel & Sumikin Chemical Co., Ltd.
EHPE3150 (1,2-epoxy-4-(2-oxiranyl) cyclohexane adduct (solid) of 2,2-bis(hydroxymethyl)-1-butanol) available from Daicel Corporation

[Solid Bifunctional Epoxy Resin]
jER-1002 (solid bisphenol-A epoxy resin) available from Mitsubishi Chemical Corporation
OGSOL PG-100 (fluorene epoxy resin) available tram Osaka Gas Chemicals Co., Ltd.

[Photoacid Generator]
CPI-101A (sulfonium hexafluoroantimonate) available from San-Apro, Ltd.

[Antioxidant]
Songnox 1010 (hindered phenol antioxidant) available from Kyodo Chemical Co., Ltd.
HCA (phosphate antioxidant) available from Sanko Co., Ltd.

Examples 1 to 11, Comparative Examples 1 and 2, and Reference Example 1

<Preparation of Cladding Layer Forming Material and Core Layer Forming Material>

Under shaded conditions, ingredients were blended together at 110° C. into complete dissolution according to formulations shown below in Tables 1 and 2. The proportions of the solid semi-aliphatic bifunctional epoxy resin (YX-7180BH40) are on a solid resin weight basis. The mixed solvent (having a cyclohexanone/methyl ethyl ketone mixing weight ratio of 1/1) contained in a proportion of 60 wt. % in the solid semi-aliphatic bifunctional epoxy resin (YX7180BH40) was basically sufficient for the complete dissolution of the ingredients. In Examples 4 to 11 in which the solid semi-aliphatic bifunctional epoxy resin (YX7180BH40) was contained in small proportions, in Comparative Examples 1 and 2 in which the solid semi aliphatic bifunctional epoxy resin (YX7180BH40) was not used, and in Reference Example 1 (core layer forming material), the viscosities of the solutions were adjusted by using cyclohexanone as required (the use amounts of cyclohexanone as the organic solvent are shown below in Tables 1 and 2).

Thereafter, the resulting solutions were each cooled to a room temperature (25° C.), and then filtered under higher-temperature and higher-pressure conditions with the use of a membrane filter having a pore diameter of 1.0 μm. Thus, photosensitive varnishes (cladding layer forming materials) were prepared. The refractive indexes shown below in Tables 1 and 2 are for the cladding layer forming materials in Examples 1 to 11 and Comparative Examples 1 and 2, and for the core layer forming material in Reference Example 1.

The photosensitive varnishes thus prepared as the cladding layer forming materials were each evaluated for cured-state refractive index (cladding layer refractive index), R-to-R adaptability (tackiness and uncured-state flexibility), and elasticity modulus by performing measurement by the following methods. The results are shown below in Tables 1 and 2.

[Refractive Index]

The cladding layer forming materials (photosensitive varnishes) were each applied onto a 0.8-mm thick silicon wafer by means of a spin coater, and then heat-dried at 130° C. for 10 minutes. Subsequently, the resulting film was exposed to mixed radiation at 5,000 $mJ/cm^2$ based on illuminance at 365 nm (by means of an ultrahigh-pressure mercury lamp without a band pass filter) through a 5-mm thick glass mask (having no pattern), and then subjected to a post heat treatment at 140° C. for 10 minutes. Thus, a sample (having a thickness of 10 μm) for refractive index evaluation was prepared. The refractive index of the sample thus prepared was measured at a wavelength of 850 nm by means of a prism coupler (SPA-4000) available from SAIRON TECHNOLOGY, Inc.

[R-to-R Adaptability]

The photosensitive varnishes prepared as the cladding layer forming materials in the Examples and Comparative Examples were evaluated through the following measurement.

(1) Tackiness

The cladding layer forming materials (photosensitive varnishes) were each applied onto a silicon wafer, and then the resulting silicon wafer was prebaked (heat-dried) on a hot plate at 130° C. for 5 minutes. Thus, a coating film having a thickness of about 80 μm was formed. A surface of the coating film was touched with a finger for a predetermined period and, when the finger was released from the coating film, the state of the surface was checked for tackiness. The cladding layer forming materials were each evaluated based on the checking result according to the following evaluation criteria:

Excellent (○): The coating film was free from a touch mark after being touched with the finger for 10 seconds.
Acceptable (Δ): The coating film was free from a touch mark after being momentarily touched with the finger (for not longer than 1 second).
Unacceptable (x): The coating film had a touch mark even after being momentarily toughed with the finger.

(2) Flexibility of Uncured Product (Uncured Film)

The cladding layer forming materials (photosensitive varnishes) were each applied onto a polyethylene terephthalate (PET) substrate, and then heat-dried (at 130° C. for 5 minutes) Thus, an uncured film (amorphous film) having a thickness of about 80 μm was formed. Then, the amorphous film on the PET substrate was rolled around a 4-cm diameter roll core and a 2-cm diameter roll core, and checked for cracking after being rolled. The cladding layer forming materials were each evaluated based on the checking results according to the following evaluation criteria:

Excellent (○): The uncured film was free from cracking when being rolled around the 2-cm diameter roll core.
Acceptable (Δ): The uncured film was free from cracking when being rolled around the 4-cm diameter roll core, but suffered from cracking when being rolled around the 2-cm diameter roll core.
Unacceptable (x): The uncured film suffered from cracking when being rolled around the 4-cm diameter roll core.

[Elasticity Modulus]

A single-layer film having a thickness of 80 μm was formed in the same manner as in the evaluation for the refractive index. Then, a piece having a predetermined size (4 cm×0.5 cm) was cut out of the single-layer film, and used as a measurement sample. A tensile test was performed on the measurement sample by means of a tensile compression tester TG-1 kN available from Minebea Co., Ltd. for measurement of the elasticity modulus of the sample. For measurement conditions, a pulling speed was 5 mm/minute, and an inter-chuck distance was 20 mm. The cladding layer forming materials were each evaluated based on the measurement result according to the following criteria:

Excellent (○): The elasticity modulus was not less than 1.0 GPa.
Acceptable (Δ): The elasticity modulus was not less than 0.8 GPa and less than 1.0 GPa.
Unacceptable (x): The elasticity modulus was less than 0.8 GPa.

<<Production of Optical Waveguide>>
<Formation of Under-Cladding Layer>

The photosensitive varnishes prepared as the cladding layer forming materials were each applied onto a back surface of a flexible printed circuit (FPC) board substrate having an overall thickness of 22 μm by means of a spin coater, and then dried on a hot plate (at 130° C. for 10 minute) for removal of the organic solvent. In turn, the resulting layer was exposed to mixed radiation at 5,000 mJ/cm$^2$ based on illuminance at 365 nm via a mask pattern by means of a UV irradiation machine, and further subjected to a post heat treatment (at 140° C. for 10 minutes). Subsequently, the resulting layer was developed in γ-butyrolactone (at a room temperature (25° C.) for 3 minutes), and rinsed with water. Then, the resulting layer was dried on a hot plate (at 120° C. for 5 minutes) for removal of water. Thus, an under-cladding layer (having a thickness of 15 μm) was formed.

<Formation of Core Layer>

The photosensitive varnish prepared as the core layer forming material (Reference Example 1) was applied onto the thus formed under-cladding layer by means of a spin coater, and then dried on a hot plate (at 130° C. for 5 minutes) for removal of the organic solvent. Thus, an uncured layer was formed in an uncured film state. The uncured layer thus formed was exposed at 8,000 mJ/cm$^2$ (integrated at a wavelength of 365 nm) via a glass mask pattern (pattern width/pattern pitch (L/S)=50 μm/200 μm) by means of a UV irradiation machine (including an ultrahigh pressure mercury lamp capable of emitting full spectrum light without a band pass filter), and then subjected to a post heat treatment (at 140° C. for 10 minutes). Thereafter, the resulting layer was developed in γ-butyrolactone (at a room temperature (25° C.) for 3 minutes, and rinsed with water. Then, the resulting layer was dried on a hot plate (at 120° C. for 5 minutes) for removal of water. Thus, a core layer (having a thickness of 50 μm) was formed in a predetermined pattern.

<Formation of Over-Cladding Layer>

The photosensitive varnishes prepared as the cladding layer forming materials were each applied over the thus formed core layer by means of a spin coater, and then dried on a hot plate (at 130° C. for 10 minutes) for removal of the organic solvent Thereafter, the resulting layer was exposed at 5,000 mJ/cm$^2$ (through an I-line filter), and then subjected to a post-exposure heat treatment (PEB process) at 140° C. for 10 minutes. Further, the resulting layer was developed in γ-butyrolactone (at, a room temperature (25° C.) for 3 minutes), and rinsed with water. Then, the resulting layer was dried on a hot plate (at 120° C. for 10 minutes) for removal of water. Thus, an over-cladding layer (having a thickness of 10 μm on the core layer) was formed, whereby an optical waveguide (having an overall thickness of 75 μm) was produced.

The optical waveguides thus produced were each evaluated for layer patternability and mirror forming processability (laser processability at a wavelength of 248 nm) by the following methods, and comprehensively evaluated. The evaluation results are shown below in Tables 1 and 2.

[Patternability]

The patterns of the respective layers formed under the aforementioned conditions were each observed by means of a microscope for checking the appearance thereof. Based on the observation result, the patterns were each evaluated according to the following criteria:

Excellent (○): The pattern had a rectangular shape.
Acceptable (Δ): The pattern had a rounded portion at its upper portion, but was not functionally problematic.

Unacceptable (x): The pattern had an abnormal shape, and was functionally problematic.

[Mirror Forming Processability (Laser Processability at Wavelength of 248 nm)]

Over-cladding layer surfaces of the produced optical waveguides were each processed by excimer laser under predetermined processing conditions (at an energy density of 300 mJ/cm² at a frequency of 100 Hz at a scanning speed of 0.08 mm/second with the use of a laser processing machine M-8000 available from EXITECH Ltd.), whereby the optical waveguides were each formed with a 45-degree mirror surface. Then, the optical waveguides each formed with the 45-degree mirror surface by the laser processing were each used as a sample for evaluation. Light emitted at a wavelength of 850 nm from a VCSEL light source OP250 (available from Miki Inc.) was collected and inputted into the sample optical waveguide through a multi-mode fiber (FFP-G120-0500 available from Miki Inc., and having an MMF diameter of 50 μm and an NA of 0.2). Then, light outputted from the sample optical waveguide was collected by a lens (FH14-11 available from Seiwa Optical Co., Ltd., and having a magnification of 20 and an NA of 0.4), and detected at 6 channels by a light measurement system (optical multi-power meter Q8221 available from Advantest Corporation) for the evaluation. Based on the result, the sample optical waveguide was evaluated according to the following criteria:

Excellent (○): The formed 45-degree mirror had a light loss of not greater than 1.0 dB.
Acceptable (Δ): The formed 45-degree mirror had a light loss greater than 1.0 dB and not greater than 1.5 dB.
Unacceptable (x): The formed 45-degree mirror had a light loss of greater than 1.5 dB

[Comprehensive Evaluation]

Based on the above evaluation results, the comprehensive evaluation was performed according to the following criteria:

Excellent (○): All the ratings of the evaluation items were excellent (○).
Acceptable (Δ): None of the ratings of the evaluation items was unacceptable (x), but at least one of the ratings of the evaluation items was acceptable (Δ).
Unacceptable (x): At least one of the ratings of the evaluation items was unacceptable (x).

TABLE 1

| Category | Product name | Example 1 | 2 | 3 | 4 | 5 | 6 | 7 | 8 | 9 | 10 | 11 (parts) |
|---|---|---|---|---|---|---|---|---|---|---|---|---|
| Solid semi-aliphatic bifunctional epoxy resin | YX-7180BH40 | 60 | 60 | 50 | 40 | 40 | 30 | 30 | 20 | 20 | 10 | 10 |
| Liquid semi-aliphatic epoxy resin | EPICLON EXA-4816 | — | — | — | — | — | — | — | — | — | — | — |
| Solid polyfunctional epoxy resin | YDCN-700-3 | 5 | 10 | 20 | 20 | 10 | 20 | 10 | 20 | 10 | 10 | 20 |
|  | EHPE3150 | 35 | 30 | 30 | 30 | 30 | 30 | 30 | 30 | 30 | 30 | 30 |
| Solid bifunctional epoxy resin | jER-1002 | — | — | — | 10 | 20 | 20 | 30 | 30 | 40 | 50 | 40 |
|  | OGSOL PG-100 | — | — | — | — | — | — | — | — | — | — | — |
| Photoacid generator | CPI-101A | 2 | 2 | 2 | 2 | 2 | 2 | 2 | 2 | 2 | 2 | 2 |
| Antioxidant | Songnox 1010 | 0.5 | 0.5 | 0.5 | 0.5 | 0.5 | 0.5 | 0.5 | 0.5 | 0.5 | 0.5 | 0.5 |
|  | HCA | 0.5 | 0.5 | 0.5 | 0.5 | 0.5 | 0.5 | 0.5 | 0.5 | 0.5 | 0.5 | 0.5 |
| Organic solvent (cyclohexanone) |  | — | — | — | 10 | 10 | 20 | 20 | 30 | 30 | 40 | 40 |
| Refractive index |  | 1.545 | 1.549 | 1.550 | 1.552 | 1.552 | 1.554 | 1.554 | 1.556 | 1.556 | 1.557 | 1.557 |
| R-to-R adaptability | Tackiness | Δ | Δ | Δ | ○ | ○ | ○ | ○ | ○ | ○ | ○ | ○ |
|  | Uncured-state flexibility | ○ | ○ | ○ | ○ | ○ | ○ | ○ | ○ | ○ | Δ | Δ |
| Patternability |  | Δ | Δ | ○ | ○ | ○ | ○ | ○ | ○ | Δ | Δ | ○ |
| Elasticity modulus (GPa) |  | Δ | Δ | ○ | ○ | ○ | ○ | ○ | ○ | ○ | ○ | ○ |
| Mirror forming processability (Laser processability at wavelength of 248 nm) |  | Δ | ○ | ○ | ○ | ○ | ○ | ○ | ○ | ○ | ○ | ○ |
| Comprehensive evaluation |  | Δ | Δ | Δ | ○ | ○ | ○ | ○ | ○ | Δ | Δ | Δ |

TABLE 2

| Category | Product name | Comparative Example 1 | 2 | Reference Example 1* (parts) |
|---|---|---|---|---|
| Solid semi-aliphatic bifunctional epoxy resin | YX-7180BH40 | — | — | — |
| Liquid semi-aliphatic epoxy resin | EPICLON EXA-4816 | — | 15 | — |
| Solid polyfunctional epoxy resin | YDCN-700-3 | — | — | 50 |
|  | EHPE3150 | 30 | 30 | — |

TABLE 2-continued

|  |  | Comparative Example | | (parts) |
|---|---|---|---|---|
| Category | Product name | 1 | 2 | Reference Example 1* |
| Solid bifunctional epoxy resin | jER-1002 | 70 | 55 | 30 |
|  | OGSOL PG-100 | — | — | 20 |
| Photoacid generator | CPI-101A | 2 | 2 | 0.5 |
| Antioxidant | Songnox 1010 | 0.5 | 0.5 | 0.5 |
|  | HCA | 0.5 | 0.5 | 0.125 |
| Organic solvent (cyclohexanone) |  | 50 | 50 | 50 |
| Refractive index |  | 1.559 | 1.556 | 1.592 |
| R-to-R adaptability | Tackiness | ○ | × | ○ |
|  | Uncured-state flexibility | × | × | — |
| Patternability |  | ○ | ○ | ○ |
| Elasticity modulus (GPa) |  | ○ | ○ | — |
| Mirror forming processability (Laser processability at wavelength of 248 nm) |  | ○ | ○ | — |
| Comprehensive evaluation |  | × | × | — |

*Refractive index was adjusted for core layer forming material.

The above results indicate that the Examples, which use the photosensitive epoxy resin compositions each containing the epoxy resin component including the specific epoxy resin, i.e., the solid semi-aliphatic bifunctional epoxy resin, each have a lower refractive index, and are excellent in R-to-R adaptability, elasticity modulus, patternability, and mirror forming processability. Particularly, Examples 4 to 8, characterized in that the proportion of the aromatic ring-containing epoxy resin including the solid semi-aliphatic bifunctional epoxy resin is not less than 65 wt. % based on the overall weight of the epoxy resin component, that epoxy resin component includes the solid semi-aliphatic bifunctional epoxy resin, the polyfunctional epoxy resin, and the bifunctional epoxy resin other than the solid semi-aliphatic bifunctional epoxy resin, that the proportion of the polyfunctional epoxy resin is not less than 40 wt. % based on the overall weight of the epoxy resin component, and that the proportion of the bifunctional epoxy resin other than the solid semi-aliphatic bifunctional epoxy resin is not greater than 50 wt. % based on the overall weight of the epoxy resin component, are particularly excellent with excellent results in all the evaluation items.

In contrast, Comparative Examples 1 and 2, which do not use the specific epoxy resin, i.e., the solid semi-aliphatic bifunctional epoxy resin, as the epoxy resin component, have inferior property evaluation results with at least one of the evaluation items rated as unacceptable (×).

While specific forms of the embodiments of the present disclosure have been shown in the aforementioned examples, the examples are merely illustrative of the disclosure but not limitative of the disclosure. It is contemplated that various modifications apparent to those skilled in the art could be made within the scope of the disclosure.

The optical waveguide formation photosensitive epoxy resin composition of the present disclosure is useful as a material for formation of a cladding layer or a core layer of an optical waveguide. An optical waveguide produced by using the optical waveguide formation photosensitive epoxy resin composition as the cladding layer forming material or the core layer forming material is used, for example, for a hybrid flexible printed wiring board for optical/electrical transmission, or the like.

The invention claimed is:

1. A photosensitive epoxy resin composition for formation of an optical waveguide, the photosensitive epoxy resin composition consisting of:
    a solid epoxy resin component;
    a photo-cationic polymerization initiator;
    optionally at least one additive selected from the group consisting of an adhesiveness imparting agent, an antioxidant, a leveling agent, and a defoaming agent, and
    optionally an organic solvent
    wherein the solid epoxy resin component comprises a solid semi-aliphatic bifunctional epoxy resin, and
    wherein an aromatic ring-containing epoxy resin including the solid semi-aliphatic bifunctional epoxy resin is present in a proportion of not less than 65 wt. % based on an overall weight of the solid, epoxy resin component in the solid epoxy resin component.

2. The photosensitive epoxy resin composition according to claim 1, wherein the solid semi-aliphatic bifunctional epoxy resin is a solid semi-aliphatic bifunctional epoxy resin represented by the following general formula (1):

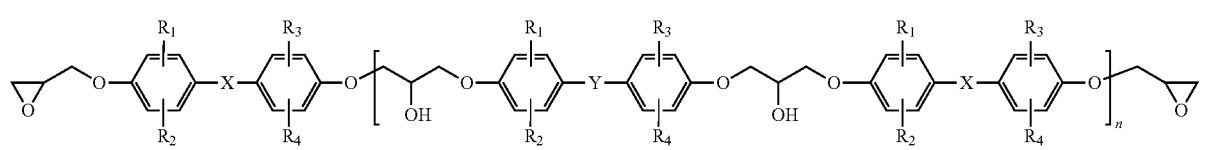

(1)

wherein $R_1$ to $R_4$, which may be the same or different, are each hydrogen atom, methyl group, chlorine atom, or bromine atom; X and Y, which may be the same or different, are each $C_1$ to $C_{15}$ alkylene group or alkyleneoxy group; and n is a positive number.

3. The photosensitive epoxy resin composition according to claim 1, wherein the solid semi-aliphatic bifunctional epoxy resin is present in a proportion of 10 to 60 wt. % in the solid epoxy resin component.

4. The photosensitive epoxy resin composition according to claim 1, wherein the solid epoxy resin component comprises (i) a solid polyfunctional epoxy resin, and (ii) a solid bifunctional epoxy resin other than the solid semi-aliphatic bifunctional epoxy resin, in addition to the solid semi-aliphatic bifunctional epoxy resin, and wherein the solid bifunctional epoxy resin other than the solid semi-aliphatic bifunctional epoxy resin is at least one selected from the group consisting of bisphenol-A epoxy resin, fluorene epoxy resin, and hydrogenated bisphenol-A epoxy resin.

5. The photosensitive epoxy resin composition according to claim 4, wherein the solid polyfunctional epoxy resin is present in a proportion of not less than 40 wt. % based on the overall weight of the solid epoxy resin component, wherein the solid bifunctional epoxy resin other than the solid semi-aliphatic bifunctional epoxy resin is present in a proportion of not greater than 50 wt. % based on the overall weight of the solid epoxy resin component.

6. A curable film for formation of an optical waveguide, the curable film being formed from the photosensitive epoxy resin composition according to claim 1.

7. An optical waveguide comprising:
a substrate;
a cladding layer provided on the substrate; and
a core layer provided in a predetermined pattern in the cladding layer for transmission of an optical signal;
wherein the cladding layer or the core layer comprises a cured product of the photosensitive epoxy resin composition according to claim 1.

8. A hybrid flexible printed wiring board for optical/electrical transmission, which comprises the optical waveguide according to claim 7.

* * * * *